(12) United States Patent
Roth et al.

(10) Patent No.: US 8,885,679 B1
(45) Date of Patent: Nov. 11, 2014

(54) MODE-HOP FREE ATHERMAL LASER

(71) Applicant: Aurrion, Inc., Goleta, CA (US)

(72) Inventors: Jonathan Edgar Roth, Santa Barbara, CA (US); Gregory Alan Fish, Santa Barbara, CA (US); Erik Johan Norberg, Santa Barbara, CA (US); Robert Silvio Guzzon, Santa Barbara, CA (US); Brian R. Koch, San Carlos, CA (US)

(73) Assignee: Aurrion, Inc., Goleta, CA (US)

( * ) Notice: Subject to any disclaimer, the term of this patent is extended or adjusted under 35 U.S.C. 154(b) by 0 days.

(21) Appl. No.: 13/907,569

(22) Filed: May 31, 2013

(51) Int. Cl.
*H01S 3/13* (2006.01)
*H01S 5/068* (2006.01)

(52) U.S. Cl.
CPC ..................... *H01S 5/068* (2013.01)
USPC ............ 372/29.011; 372/29.022; 372/29.023; 372/8; 372/30; 372/31; 372/33

(58) Field of Classification Search
USPC ........... 372/8, 29.011, 29.022, 29.023, 30–32
See application file for complete search history.

(56) References Cited

U.S. PATENT DOCUMENTS

| | | | |
|---|---|---|---|
| 3,487,327 A * | 12/1969 | Clark | 372/32 |
| 5,022,034 A * | 6/1991 | May et al. | 372/26 |
| 5,313,333 A | 5/1994 | O'Brien et al. | |
| 5,914,972 A | 6/1999 | Siala et al. | |
| 6,320,888 B1 | 11/2001 | Tanaka et al. | |
| 8,594,144 B1 * | 11/2013 | Bagg | 372/38.02 |
| 2013/0044974 A1 | 2/2013 | Doerr | |

OTHER PUBLICATIONS

Doerr, Christopher R., "Proposed Architecture for MIMO Optical Demultiplexing Using Photonic Integration, IEEE Photonics Technology Letters", vol. 23, No. 21, Nov. 1, 2011, 1573-1575.
Phelan, R., et al., "2408C < T < 958 C mode-hop-free operation of uncooled AlGaInAs-MQW discrete-mode laser diode with emission at $\lambda = 1.3$ μm", Electronics Letters, Jan. 1, 2009, vol. 45 No. 1, (Jan. 1, 2009), pp. 2.

* cited by examiner

*Primary Examiner* — Dung Nguyen
(74) *Attorney, Agent, or Firm* — Schwegman Lundberg & Woessner, P.A.

(57) ABSTRACT

Embodiments of the invention describe integrating a phase shifting component into a cavity of a laser. Said phase shifter is capable of a continuous phase shift at a single wavelength over a large range (where the maximum energy consumption of the phase shifting component does not scale with the phase shifting range). In other words, said phase shifter is used to form a configurable optical cavity length for a laser. Embodiments of the invention thus utilize a plurality of optical cavity lengths—including one or more optical cavity lengths to potentially shift the phase of the output optical signal, to maintain a laser cavity's output wavelength and avoid spatial mode-hops in the presence of fluctuations such as temperature drift or changes to the drive current of the laser.

20 Claims, 5 Drawing Sheets

MODE-HOP FREE ATHERMAL LASER

FIELD

Embodiments of the invention generally pertain to optical devices and more specifically to athermal laser cavities.

BACKGROUND

The output characteristics of a semiconductor laser depend, in part, on its operating temperature. The wavelength of a laser's output signal may change gradually with temperature; however, at some temperature values, the wavelength of the laser's output signal may make discrete jumps. FIG. 1 is a graph illustrating an example of these discrete jumps as a function of device temperature. As illustrated in graph 100, these jumps occur when device temperature increases and the output signal changes from one longitudinal mode to another (referred to herein as "mode-hopping").

Several solutions in the prior art exist to eliminate or reduce mode-hops. These solutions include passively compensating for temperature changes using different materials within the laser cavity (e.g., use of waveguide materials with negative thermal coefficients of refractive index (dn/dT), or cavity designs that utilize materials with temperature coefficients of expansion to get an athermal response). These passive, feedback-free methods of stabilization can compensate for uniform temperature changes, but cannot compensate for fluctuations within a laser cavity; furthermore, the passive tuning may have a limited temperature operating range due to lack of precision of tuning and lack of feedback. Furthermore, these passive solutions are difficult to employ in a photonic integrated circuit (PIC) due to the difficulty of using non-standard materials with -dn/dT and due to the difficulty in packaging a system with an external cavity with the required temperature coefficient of expansion.

Other solutions allow for changing the effective cavity length of the laser cavity when the device temperature changes. These solutions result in the mode continuously changing wavelengths without mode-hops as the temperature changes. These solutions have the disadvantage that as the temperature changes, the cavity has a large shift in the operating wavelength making it unsuitable for many implementations, such as wavelength division multiplexing (WDM).

Other prior art solutions heat the entire packaged PIC containing a laser to a fixed temperature, or heating the laser cavity only using on-chip heaters. Heating an entire laser or package is power-inefficient, and using this approach, the laser must be heated to the highest temperature in its designed operating range; furthermore, semiconductor lasers tend to operate more efficiently at lower temperatures, so heating a device to its maximum operating temperature compromises the power efficiency of the laser.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DESCRIPTION

Embodiments of the invention describe systems, apparatuses and methods for eliminating mode-hops in the presence of laser device temperature fluctuations (e.g., temperature changes in the laser cavity). Throughout this specification, several terms of art are used. These terms are to take on their ordinary meaning in the art from which they come, unless specifically defined herein or the context of their use would clearly suggest otherwise. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Figure 1:
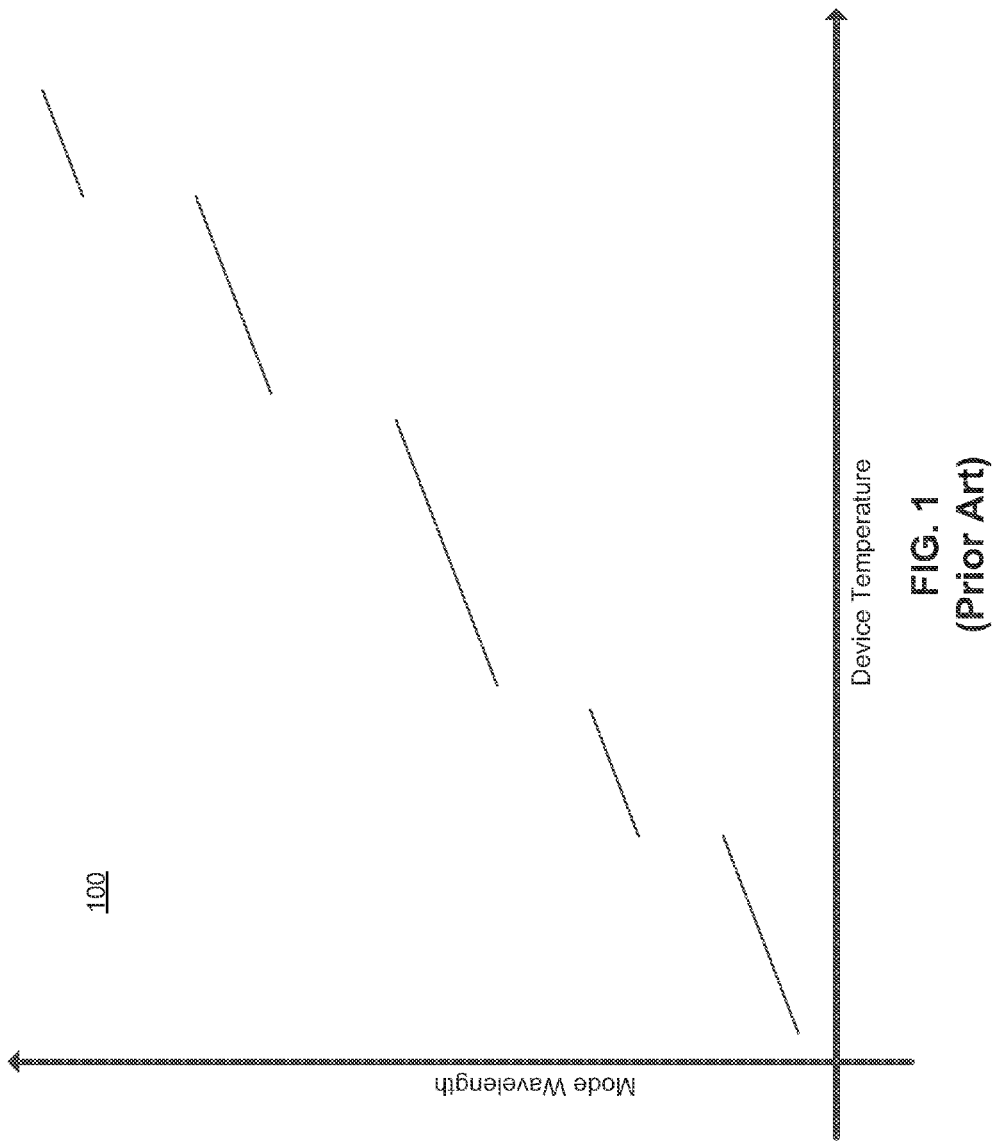
FIG. 1 is a graph illustrating "mode-hopping" in prior art laser devices.
Figure 2:
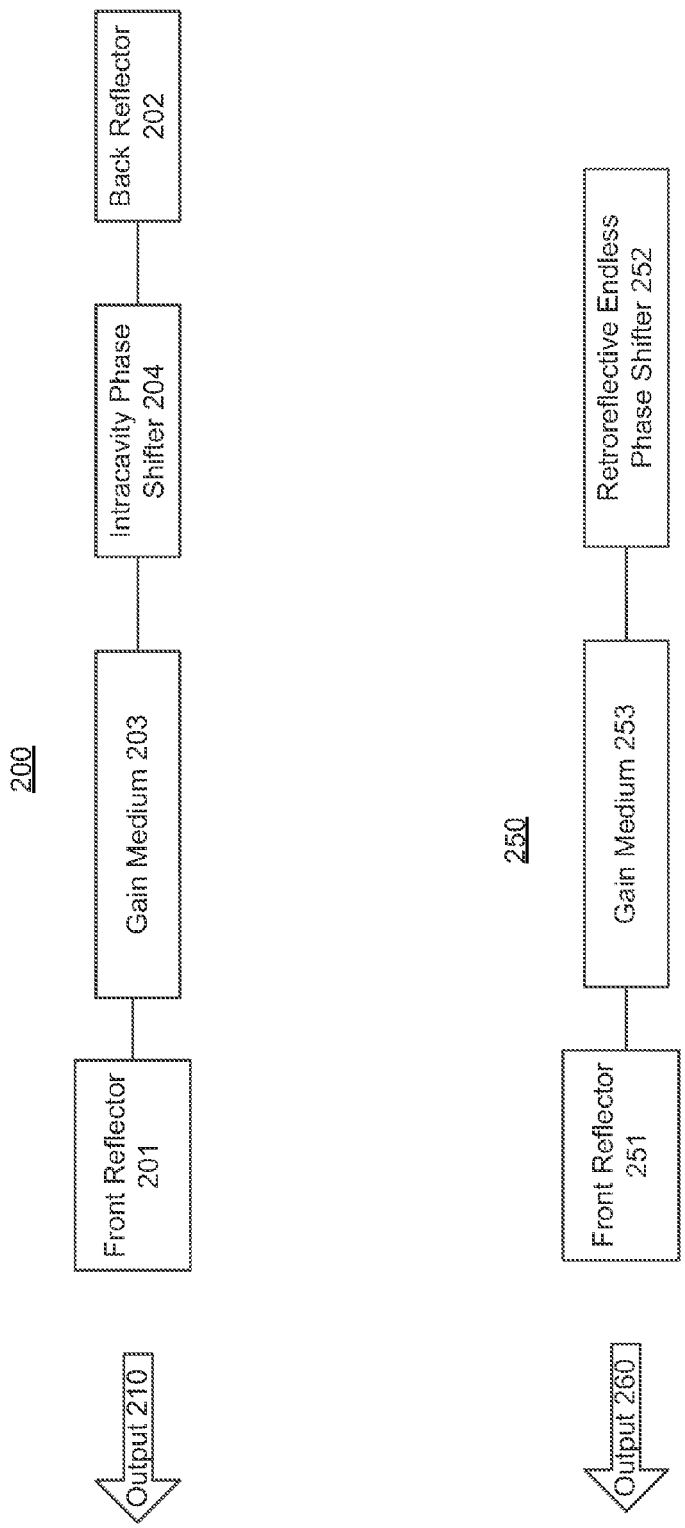
FIG. 2 is an illustration of mode-hop free lasers according to embodiments of the invention.

FIG. 2 is an illustration of mode-hop free lasers according to embodiments of the invention. Laser 200 is shown to include a laser cavity formed by front reflector 201 and back reflector 202; gain medium 203 and intracavity phase shifter 204 are included in said laser cavity. While illustrated in this example as a linear cavity, said laser cavity may comprise any shape in other embodiments of the invention; for example, in some embodiments, ring-shaped laser cavities are utilized. An optical signal is transmitted from laser 200 via output port 210.

Gain medium 203 may comprise any structure or material suitable for amplifying an optical signal. For example, gain medium 203 may be formed from a III-V semiconductor material, a germanium (Ge) material, etc. The components of laser 200 may be formed from any combination of suitable semiconductor materials—e.g., formed from both a silicon and a non-silicon material. Said non-silicon material (alternatively referred to as "heterogeneous material") may comprise one of III-V material, magneto-optic material, or crystal substrate material. Laser 200 may further be included in a system of discrete optical components, or in a photonic integrated circuit (PIC) comprising multiple optical components.

As described herein, embodiments of the invention integrate a phase shifting component, such as intracavity phase shifter 204, into the cavity of a laser; said phase shifter is capable of a continuous phase shift at a single wavelength over a large range (where the maximum energy consumption of the phase shifting component does not scale with the phase shifting range). Phase shifter 204 may utilize any suitable process for changing the phase of the optical signal of laser 200, such as utilizing resistive heaters, resistive heating of doped silicon, silicon carrier injection or depletion modulators, heterogeneous-integrated III-V phase modulators, or native substrate III-V phase modulators.

In other words, phase shifter 204 is used to form a configurable optical cavity length for laser 200. Embodiments of the invention thus utilize a plurality of optical cavity lengths including one or more optical cavity lengths to potentially shift the phase of the optical signal to maintain a laser cavity's output wavelength and avoid mode-hops in the presence of fluctuations such as temperature drift or laser drive current changes (detected via any feedback component suitable to detect a phase/frequency/wavelength change of the optical signal of laser 200).

A switch may be included in said optical cavity to select an optical cavity length for the optical signal: a first optical cavity length and a second configurable cavity length. In this embodiment, said first optical cavity length comprises a 'constant' (i.e., fixed) length; in other embodiments, however, said first optical cavity length may also be configurable. In some embodiments, said switch may comprise a Mach-Zehnder Interferometer (MZI). In response to detecting at least one of said phase shifting elements (e.g., phase shifter 204) is at a minimum or maximum phase shifting limit the switch may select a first constant optical cavity length; the second configurable optical cavity length is selected subsequent to resetting the at least one phase shifting element away from its respective phase shifting limit or otherwise. For example, in response to detecting a phase or wavelength change for the optical signal, the switch may select a second optical cavity length configurable to shift the phase of the optical signal, the second optical cavity length formed from a plurality of optical couplers (for example, multimode interference (MMI) structures and directional couplers). The second (configurable) optical cavity length comprises the same effective length as the first (constant) optical cavity length when the phase is shifted by an integer multiple of 2*PI.

The phase shifting component is adjusted to avoid mode hops by compensating for phase shifts caused by temperature fluctuations in the rest of the laser cavity. The total required phase shift range may be quite large (i.e., many cycles of 2*PI), especially in embodiments comprising long-cavity lasers operated over a large temperature range, due to the dn/dT of the material making up the cavity.

The phase shifting component may be able to continuously shift the phase without limit (alternatively referred to herein as an "endless phase shifter"). Embodiments of the invention allow for the continuous shifting of phase at a single frequency without a discontinuity—e.g., utilize a single phase shifting component with a range of at least 0-2*PI (e.g., 0-4*PI, etc.).

Laser 250 of FIG. 2 illustrates an alternative architecture for an athermal laser cavity utilizing a retroreflective phase shifter. Laser 250 is shown to include a cavity formed from front reflector 251 and retroreflective phase shifter 252; gain medium 253 amplifies the optical signal, which is subsequently output via output port 260. An example architecture of retroreflective phase shifter 252 is discussed below.

Figure 3:
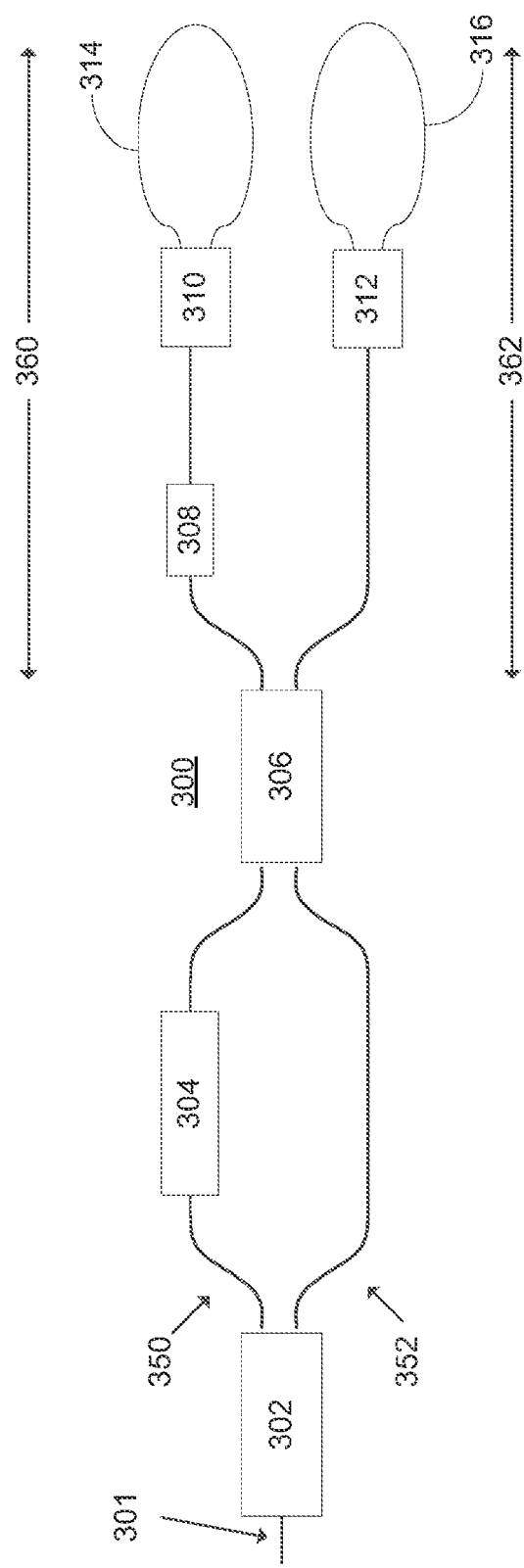
FIG. 3 is an illustration of a retroreflective endless phase shifter to eliminate mode-hops according to an embodiment of the invention.

FIG. 3 is an illustration of a retroreflective endless phase shifter to eliminate mode-hops according to an embodiment of the invention.

In this embodiment, endless phase shifter 300 includes phase shifting components 304 and 308, and a plurality of couplers to selectively direct an optical signal to retroreflective optical paths 360 (including phase shifting component 308) or 362 (i.e., 1×2 couplers 302, 310 and 312 and 2×2 coupler 306). In some embodiments, these couplers may be MMIs or directional couplers. Couplers 302 and 306, waveguides 350 and 352, and phase shifting component 304 comprise an MZI designed to switch the light from input/output port 301 to either of the retroreflective paths, either upper path 360 including phase shifter 308, 1×2 coupler 310, and ring 314, or lower path 362 including 1×2 coupler 312 and ring 316. Phase shifting component 304 may therefore switch between discrete phase shift values and phase shifter 308 may tune smoothly except during a 'reset' switching operation (i.e., resetting the phase shifter away from its minimum or maximum phase shifting limit).

Phase shifting component 308 may comprise any range such that the phase difference between retroreflective optical paths 360 and 362 comprises an integer multiple of 2*PI (and thus induce the same return phase); in other words, for a laser cavity utilizing endless phase shifter 300 in the configuration shown in FIG. 2 to be mode-hop-free at a particular output wavelength, the absolute optical path length does not need to remain constant but the net phase shift in a round trip of the cavity is an integer multiple of 2*PI. For example, component 304 may comprise a line phase shifter having a range of PI/2-3*PI/2, while component 308 may comprise a line phase shifter having a range of 0-2*PI.

In this embodiment, said phase shifting components and couplers are included in the cavity of endless phase shifter 300, and further utilize the retroreflector of the laser (as shown by retroreflective loops 314 and 316) so that the light passes twice through phase shifting component 308, thereby reducing the amount of phase shift and switching needed in this embodiment.

In contrast to prior art solutions utilizing a heater-based phase shifter to compensate over a large temperature range employing a wide range of phase shift, use of this invention allows the phase-shifting range to be limited to a smaller range (e.g., 2*PI radians, 4*PI radians). When the phase shifter reaches the endpoint of its range, a reset function is employed where the light is switched from path 360 containing the phase shifter to path 362 (which comprises a constant optical cavity length), and the phase shifter is shifted by 2*PI towards the center of its range.

Therefore during said reset operation, the optical signal of endless phase shifter 300 is switched from phase shifter path 360 to alternate path 362, resets phase shifter component 308 towards the center of its range, and the optical signal of endless phase shifter 300 is switched back to phase shifter path 360 when its net phase is an integer multiple 2*PI of the phase of path 362. The above described process ensures that no mode-hops are present during the transition and the optical signal output remains stable. An example process for operating a mode-hop free laser is discussed below.

Figure 4:
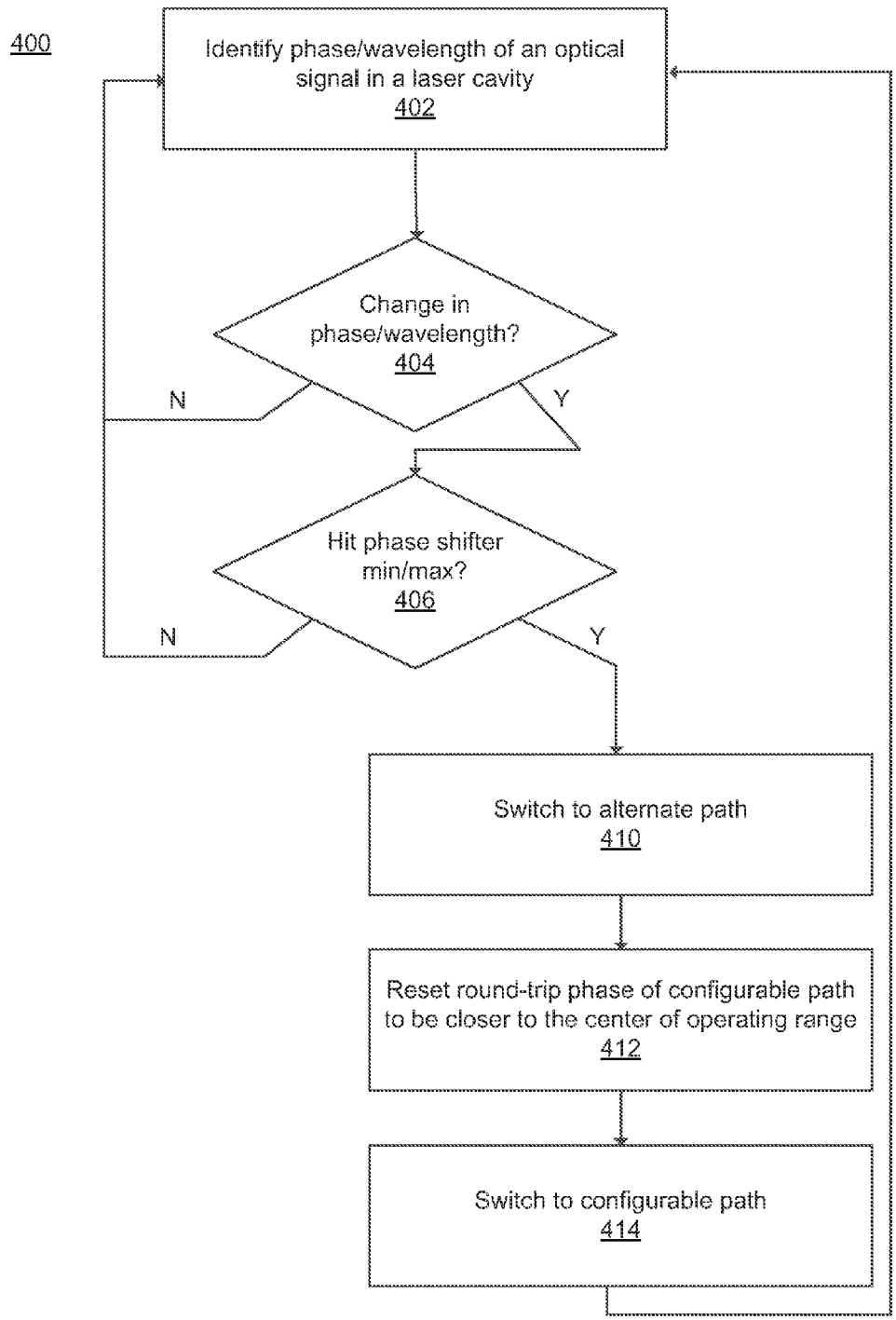
FIG. 4 is a flow diagram for adjusting the round-trip phase of the optical path in a laser cavity at the operating wavelength to eliminate mode-hops according to an embodiment of the invention.

FIG. 4 is a flow diagram for adjusting the round-trip phase of the optical path in a laser cavity at the operating wavelength to eliminate mode-hops according to an embodiment of the invention. Flow diagrams as illustrated herein provide examples of sequences of various process actions. Although shown in a particular sequence or order, unless otherwise specified, the order of the actions can be modified. Thus, the illustrated implementations should be understood only as examples, and the illustrated processes can be performed in a different order, and some actions may be performed in parallel. Additionally, one or more actions can be omitted in various embodiments of the disclosure; thus, not all actions are required in every implementation. Other process flows are possible.

Process 400 includes operations for identifying a phase status of an optical signal in a laser cavity of a laser, 402; said optical signal goes through a path having a configurable optical cavity length (rather than an alternative path such as a 'fixed' path having a fixed optical cavity length or another configurable optical path), where it is continuously measured to detect any phase change. Said optical signal is either in phase, or is changing phase due to the presence of operating condition fluctuations such as temperature drift or changes to the laser's drive current. This change in phase is indicative of a potential mode-hop, as described above.

If there is a phase change, 404, then the phase shift in the configurable optical cavity length (i.e., path) is adjusted so that the phase change is re-adjusted to zero (i.e., a feedback loop). In the course of adjusting the configurable optical cavity length, it is determined if a maximum or minimum (max/min) value in the phase shifter's range has been reached, 406. If the configurable optical cavity length is at the max/min of its phase range, then a 'reset' process is initiated.

During this reset operation process, at this max/min range of the configurable path, the two optical cavity lengths (i.e., the configurable and fixed path length) differ by zero or by n*2*PI. Light is switched from the configurable to the fixed path, 410. The configurable phase shifter is reset closer to or at the center of its operating range, where the fixed and configurable paths still differ by n*2*PI, 412. Light is then switched from the fixed to the configurable path, 414. The process returns to feedback/tracking operations (i.e., back to operation 402) so that configurable phase may be shifted to compensate for cavity changes (until it hits the max/min condition again).

Figure 5:
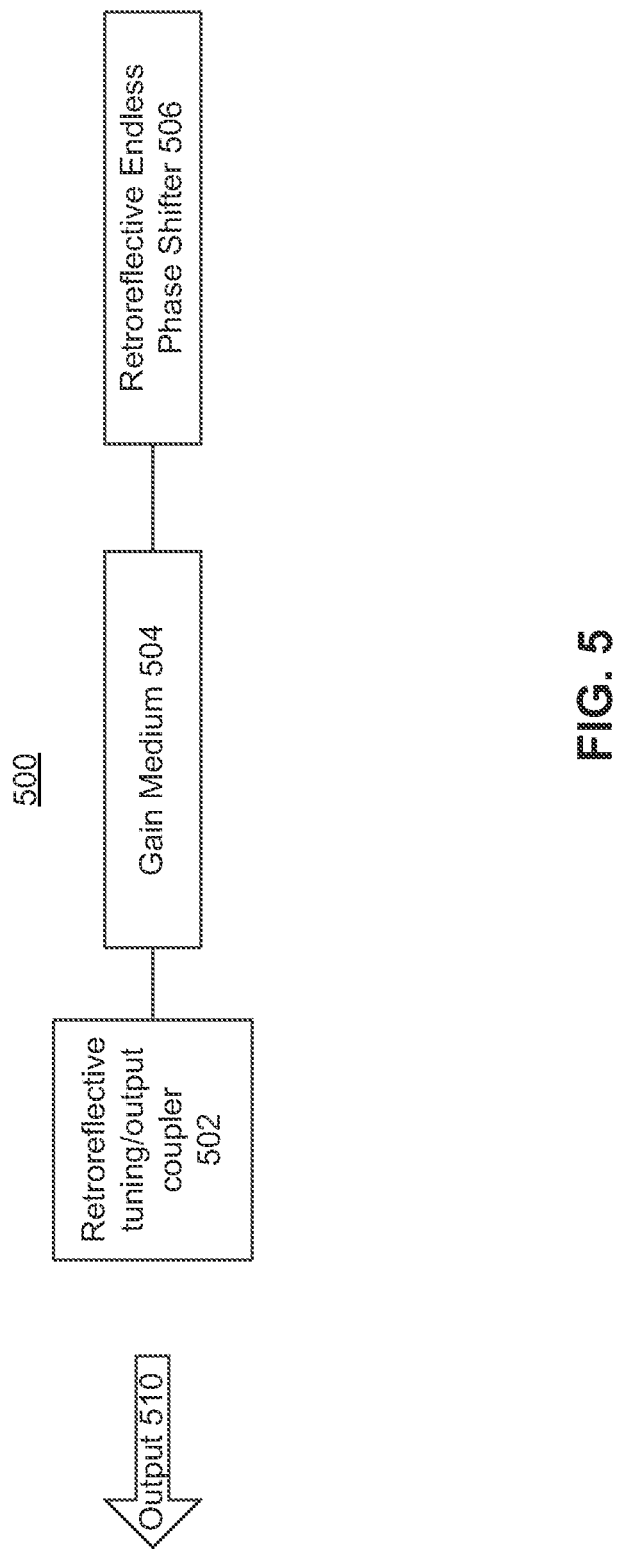
FIG. 5 is an illustration of a mode-hop free tunable laser according to an embodiment of the invention.

FIG. 5 is an illustration of a mode-hop free tunable laser according to an embodiment of the invention. In this embodiment, laser 500 includes retroreflective output/filtering component 502, gain medium 504 and retroreflective phase shifter 506.

Retroreflective output/filtering component 502 may comprise a plurality of ring filters forming a Vernier filter—e.g., a plurality of ring filters with varying radii for tuning the output signal due to the Vernier effect (i.e., a large tuning effect is accomplished by exploiting the Vernier effect, by which small relative refractive index changes may be used to yield large relative wavelength changes. Additionally by using a pair of filter elements the combined Vernier filter can have a larger free spectral range, thus filtering out unintended modes over a larger wavelength range than a single filter element). By combining this component (which may be controlled via a controller (not illustrated) to tune the output of laser 500) with retroreflective phase shifter 506 (which may comprise an architecture similar to that illustrated in FIG. 3), this embodiment describes a mode-hop free tunable laser wherein the functionality for output signal tuning and stabilization are included in a laser cavity.

Reference throughout the foregoing specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout the specification are not necessarily all referring to the same embodiment. Furthermore, the particular features, structures or characteristics may be combined in any suitable manner in one or more embodiments. In addition, it is appreciated that the figures provided are for explanation purposes to persons ordinarily skilled in the art and that the drawings are not necessarily drawn to scale. It is to be understood that the various regions, layers and structures of figures may vary in size and dimensions.

The above described embodiments of the invention may comprise silicon-on-insulator (SOI) or silicon based (e.g., silicon nitride (SiN)) devices, or may comprise devices formed from both silicon and a non-silicon material. Said non-silicon material (alternatively referred to as "heterogeneous material") may comprise one of III-V material, magneto-optic material, or crystal substrate material.

III-V semiconductors have elements that are found in group III and group V of the periodic table (e.g., Indium Gallium Arsenide Phosphide (InGaAsP), Gallium Indium Arsenide Nitride (GaInAsN)). The carrier dispersion effects of III-V based materials may be significantly higher than in silicon based materials, as electron speed in III-V semiconductors is much faster than that in silicon. In addition, III-V materials have a direct bandgap which enables efficient creation of light from electrical pumping. Thus, III-V semiconductor materials enable photonic operations with an increased efficiency over silicon for both generating light and modulating the refractive index of light.

Thus, III-V semiconductor materials enable photonic operation with an increased efficiency at generating light from electricity and converting light back into electricity. The low optical loss and high quality oxides of silicon are thus combined with the electro-optic efficiency of III-V semiconductors in the heterogeneous optical devices described below; in embodiments of the invention, said heterogeneous devices utilize low loss heterogeneous optical waveguide transitions between the devices' heterogeneous and silicon-only waveguides.

Magneto-optic materials allow heterogeneous PICs to operate based on the magneto-optic (MO) effect. Such devices may devices utilize the Faraday Effect, in which the magnetic field associated with an electrical signal modulates an optical beam, offering high bandwidth modulation, and rotates the electric field of the optical mode enabling optical isolators. Said magneto-optic materials may comprise, for example, materials such as such as iron, cobalt, or yttrium iron garnet (YIG).

Crystal substrate materials provide heterogeneous PICs with a high electro-mechanical coupling linear electro optic coefficient, low transmission loss, and stable physical and chemical properties. Said crystal substrate materials may comprise, for example, lithium niobate (LiNbO3) or lithium tantalate (LiTaO3).

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

The invention claimed is:
1. A laser comprising:
an output port to output an optical signal;
a resonant optical cavity;
a gain medium included in the cavity to amplify the optical signal;
a feedback component configured to detect a phase or wavelength change of the optical signal resulting from a temperature change of the laser; and a switch included in the optical cavity to select one of a plurality of different optical cavity lengths for the optical signal, wherein the plurality of different optical cavity lengths comprise:
- a first optical cavity length; and
- a second configurable optical cavity length configurable to shift the phase of the optical signal in response to detecting a phase or wavelength change of the optical signal, the second optical cavity length formed from a plurality of optical couplers and one or more phase shifting elements;

wherein the switch to select the first optical cavity length in response to detecting at least one of the phase shifting elements is at a minimum or maximum phase shifting limit, and to select the second configurable optical cavity length subsequent to resetting the at least one phase shifting element away from its respective phase shifting limit or otherwise.

2. The laser of claim 1, wherein one or more of the plurality of optical couplers comprises a Mach-Zehnder Interferometer (MZI).

3. The laser of claim 1, wherein the resonant optical cavity is formed, at least in part, by a retroreflector, and wherein at least one of the first or second optical cavity lengths comprises a retroreflective optical path.

4. The laser of claim 1, wherein the first and second optical cavity lengths are both formed, in part, from a shared reflector of the plurality of reflectors.

5. The laser of claim 1, wherein the laser comprises a multi-wavelength laser and the optical signal comprises a multi-wavelength optical signal.

6. The laser of claim 1, wherein the laser comprises a tunable laser and further includes:
a controller to control the wavelength of the optical signal.

7. The laser of claim 6, wherein the controller is to tune the laser via a Vernier effect.

8. The laser of claim 1, wherein the laser comprises a single-frequency laser.

9. The laser of claim 1, wherein the gain medium comprises III-V semiconductor material.

10. The laser of claim 9, wherein laser is included in a photonic integrated circuit (PIC) formed, in part, on a silicon-on-insulator (SOI) substrate.

11. The laser of claim 1, wherein the second configurable optical cavity length includes a resistive heater to generate heat to shift the phase of the optical signal.

12. The laser of claim 11, wherein the resistive heater is to heat one or more regions of doped silicon.

13. The laser of claim 1, wherein the second configurable optical cavity length is to shift the phase of the optical signal via at least one of silicon carrier injection or depletion modulation.

14. The laser of claim 1, wherein the second optical configurable cavity length is to shift the phase of the optical signal via a III-V semiconductor based phase modulator.

15. A method comprising:
identifying a phase status of an optical signal in a first path having a configurable optical cavity length of a laser, the configurable optical cavity length formed by one or more phase shifting elements and a plurality of optical couplers, the phase status of the optical signal to comprise one of:
no change in phase of the optical signal; and
a change in the phase of the optical signal resulting from a temperature change of the laser; and
in response to identifying a change in the phase of the optical signal, adjusting the configurable optical cavity length of the first path by adjusting at least one of the phase shifting elements, wherein adjusting at least one of the phase shifting elements comprises:
determining whether the at least one of the phase shifting elements is at a minimum or a maximum phase shifting limit; and
in response to determining that the at least one of the phase shifting elements is at a minimum or a maximum phase shifting limit, switching the optical signal to a second path and resetting the at least one phase shifting element away from its respective phase shifting limit.

16. The method of claim 15, wherein one or more of the plurality of optical couplers comprises a Mach-Zehnder Interferometer (MZI).

17. The method of claim 15, wherein at least one of the first or second paths comprises a retroreflective optical path.

18. The method claim 15, wherein the fixed and configurable optical cavity lengths are both formed, in part, from a shared reflector in the laser cavity.

19. The method of claim 15, wherein the laser comprises a multi-wavelength laser and the optical signal comprises a multi-wavelength optical signal.

20. The method of claim 15, wherein the laser comprises a tunable laser and the optical signal is tuned via a Vernier effect.

* * * * *